(12) United States Patent
Hoang

(10) Patent No.: US 12,431,896 B2
(45) Date of Patent: Sep. 30, 2025

(54) GATE DRIVING CIRCUIT

(71) Applicant: ROHM CO., LTD., Kyoto (JP)

(72) Inventor: Tan Nhat Hoang, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 66 days.

(21) Appl. No.: 18/482,498

(22) Filed: Oct. 6, 2023

(65) Prior Publication Data

US 2024/0039529 A1 Feb. 1, 2024

Related U.S. Application Data

(63) Continuation of application No. PCT/JP2022/017094, filed on Apr. 5, 2022.

(30) Foreign Application Priority Data

Apr. 19, 2021 (JP) ................................. 2021-070132
Jan. 28, 2022 (JP) ................................. 2022-011633

(51) Int. Cl.
*H03K 17/687* (2006.01)

(52) U.S. Cl.
CPC . *H03K 17/6872* (2013.01); *H03K 2217/0063* (2013.01); *H03K 2217/0072* (2013.01)

(58) Field of Classification Search
CPC .......................... H03K 17/687; H03K 17/6872
USPC ................................................ 327/108–112
See application file for complete search history.

(56) References Cited

U.S. PATENT DOCUMENTS

2016/0191044 A1\* 6/2016 Ikenaga .............. H04L 25/0272
327/109

FOREIGN PATENT DOCUMENTS

| JP | S59-224920 | 12/1984 |
|---|---|---|
| JP | H05-62191 | 8/1993 |
| JP | 2010-183533 | 8/2010 |
| JP | 2012-257421 | 12/2012 |
| JP | 2015-012687 | 1/2015 |
| JP | 2016-126488 | 7/2016 |
| JP | 2018-139346 | 9/2018 |
| JP | 2018-186621 | 11/2018 |
| JP | 2019-118167 | 7/2019 |

(Continued)

OTHER PUBLICATIONS

International Search Report and Written Opinion in International Appln. No. PCT/JP2022/017094, mailed on Jul. 5, 2022, 16 pages (with machine translation).

(Continued)

*Primary Examiner* — Tomi Skibinski
(74) *Attorney, Agent, or Firm* — Fish & Richardson P.C.

(57) ABSTRACT

A gate driving circuit (10X) is configured to be capable of driving a driving target transistor (QH) having a gate and a first terminal, and includes: an application terminal to which a negative voltage (VEE1) is applied; a driving transistor (MOS1) that has a control terminal fed with a control signal (MC1) and that is connected between the gate of the driving target transistor and the application terminal; and a bias switcher (101B) configured to feed the first terminal of the driving target transistor with either a ground potential (GND1) or the negative voltage selectively according to the logic level of the control signal at a timing delayed from the timing at which the control signal switches its logic level.

10 Claims, 11 Drawing Sheets

(56) References Cited

FOREIGN PATENT DOCUMENTS

JP    2020-182334     11/2020
JP     2020182334 A  * 11/2020   .......... H02M 1/0029

OTHER PUBLICATIONS

JP OA—Japanese Patent Office, Office Action in Japanese Appln. No. 2023-516426, dated Jul. 29, 2025, 11 pages (with English translation).

* cited by examiner

GATE DRIVING CIRCUIT

CROSS-REFERENCE TO RELATED APPLICATIONS

This nonprovisional application is a continuation application of International Patent Application No. PCT/JP2022/017094 filed on Apr. 5, 2022, which claims priority Japanese Patent Application No. 2021-070132 filed on Apr. 19, 2021 and Japanese Patent Application No. 2022-011633 filed on Jan. 28, 2022, the entire contents of which are hereby incorporated by reference.

TECHNICAL FIELD

The present disclosure relates to gate driving circuits.

BACKGROUND ART

Among gate driving circuits for driving the gate of a driving target transistor, some are known to have a mirror clamp function (see, for example, Patent Document 1 identified below). The mirror clamp function uses a mirror-clamp transistor that is connected to the gate of the driving target transistor. When the driving target transistor is off, the mirror-clamp transistor is turned on so that electric charge can be drawn from the gate of the driving target transistor via the mirror-clamp transistor. This prevents a rise in the gate voltage of the driving target transistor and thereby prevents the driving target transistor from turning on erroneously (erroneous turning-on).

CITATION LIST

Patent Literature

Patent Document 1: JP-A-2012-257421

DESCRIPTION OF EMBODIMENTS

Illustrative embodiments of the present invention will be described below with reference to the accompanying drawings.

1. Problems

Figure 1:
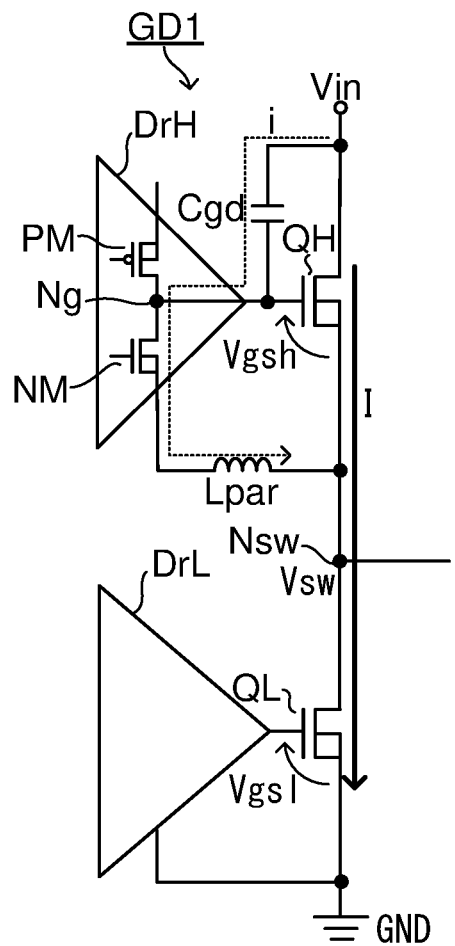
FIG. 1 is a diagram showing one example of a gate driving circuit.

FIG. 1 is a diagram showing one example of a gate driving circuit. The gate driving circuit GD1 shown in FIG. 1 drives the gates of a high-side transistor QH and a low-side transistor QL as driving target transistors.

The high-side and low-side transistors QH and QL are configured as NMOS transistors. The drain of the high-side transistor QH is connected to an application terminal for a supply voltage Vin. The source of the high-side transistor QH is connected to the drain of the low-side transistor QL at a node Nsw. The source of the low-side transistor QL is connected to a ground. The high-side and low-side transistors QH and QL are configured, for example, as MOSFETs (metal-oxide-semiconductor field-effect transistors) that use SiC, GaN, Si, or the like as a semiconductor material. The high-side and low-side transistors QH and QL may instead be configured as IGBTs (insulated-gate bipolar transistors). In a case where the high-side and low-side transistors QH and QL are IGBTs, the collector of the high-side transistor QH is connected to the application terminal for the supply voltage Vin and the emitter of the low-side transistor QL is connected to the ground.

The gate driving circuit GD1 includes a high-side driver DrH and a low-side driver DrL.

The high-side driver DrH drives the gate of the high-side transistor QH. The high-side driver DrH includes a high-side PMOS transistor PM and a low-side NMOS transistor NM. The drains of the PMOS transistor PM and the NMOS transistor NM are connected together at a node Ng, which is connected to the gate of the high-side transistor QH. The source of the PMOS transistor PM is connected to the application terminal for the supply voltage. The source of the NMOS transistor NM is connected to the source of the high-side transistor QH.

The low-side driver DrL drives the gate of the low-side transistor QL. The internal configuration of the low-side driver DrL is similar to that of the high-side driver DrH described previously and is therefore omitted from illustration in FIG. 1.

The high-side and low-side drivers DrH and DrL respectively switch the high-side and low-side transistors QH and QL complementarily to produce a switching voltage Vsw at the node Nsw. The term "complementarily" does not exclude operation in which a dead time is provided to allow the high-side and low-side transistors QH and QL to be both off.

Figure 2:
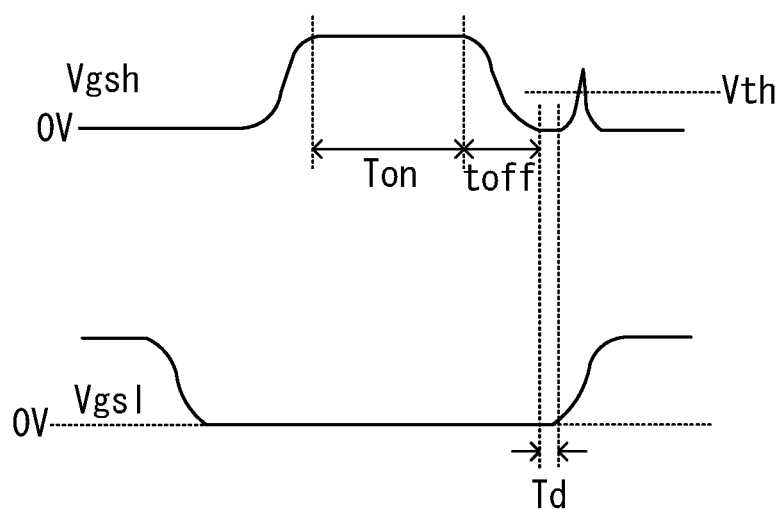
FIG. 2 is a timing chart showing an example of the waveforms of gate-source voltages in the gate driving circuit shown in FIG. 1.

FIG. 2 is a timing chart showing an example of the waveforms of the gate-source voltage Vgsh of the high-side transistor QH in FIG. 1 and the gate-source voltage Vgsl of the low-side transistor QL in FIG. 1. When in the high-side driver DrH the PMOS transistor PM is on and the NMOS transistor NM is off, the gate-source voltage Vgsh is at high level. As shown in FIG. 2, the period in which the gate-source voltage Vgsh is at high level is an on-period Ton in which the high-side transistor QH is on. In the on-period Ton, the Vgsl of the low-side transistor QL equals 0 V and the low-side transistor QL is off.

Later, when the PMOS transistor PM turns off and the NMOS transistor NM turns on, a turning-off period toff begins as shown in FIG. 2, during which period Vgsh falls to 0 V and the high-side transistor QH turns off. Now, a dead time Td begins in which the high-side and low-side transistors QH and QL are both off.

When the dead time Td ends, the low-side driver DrL raises Vgsl from 0 V and the low-side transistor QL turns on. At this time, as shown in FIG. 1, a current i passes via the gate-drain parasitic capacitance Cgd of the high-side transistor QH and via the parasitic inductance Lpar of the line connecting between the source of the NMOS transistor NM and the source of the high-side transistor QH. This causes Vgsh to hike in the positive direction. If Vgsh hikes to above a threshold voltage Vth, the high-side transistor QH turns on erroneously, that is, erroneous turning-on occurs. If this happens, as shown in FIG. 1, a through current I passes through the high-side and low-side transistors QH and QL.

Also when, after the dead time, the high-side transistor QH turns on, the Vgsl of the low-side transistor QL may hike, leading to erroneous turning-on of the low-side transistor QL. That is, at the turning-on of one of the driving target transistors, the Vgs of the other may hike to cause erroneous turning-on.

Figure 3:
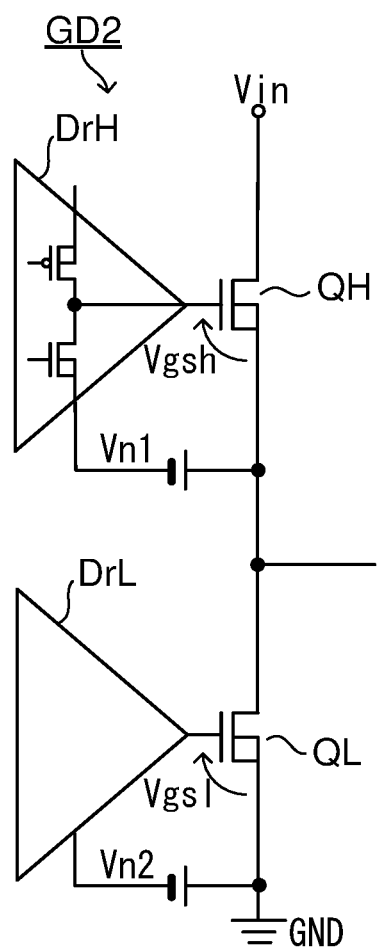
FIG. 3 is a diagram showing another example of a gate driving circuit.

FIG. 3 is a diagram showing another example of a gate driving circuit. The gate driving circuit GD2 shown in FIG. 3 differs in configuration from the gate driving circuit GD1 described previously in that the source of the NMOS transistor NM in the high-side driver DrH is fed with a negative voltage Vn1 relative to the source of the high-side transistor QH and that the source of the NMOS transistor in the low-side driver DrL is fed with a negative voltage Vn2 relative to the source (GND) of the low-side transistor QL. That is, in the gate driving circuit GD2, each driver is negatively biased.

Figure 4:
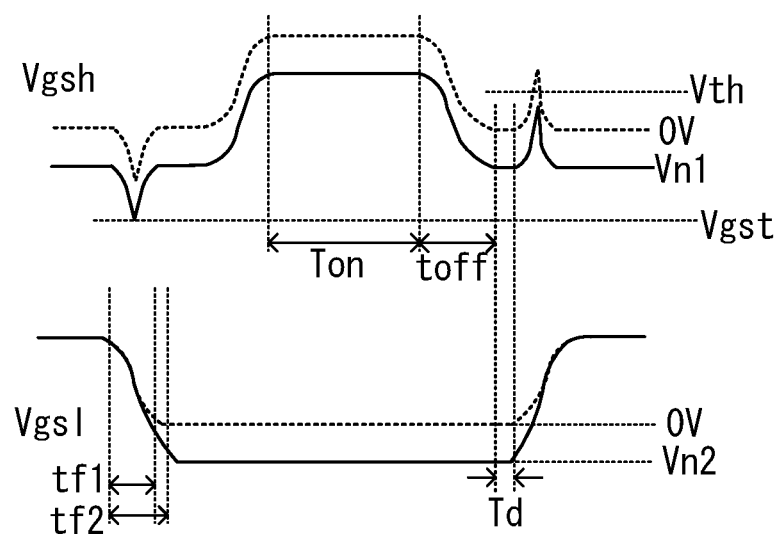
FIG. 4 is a timing chart showing an example of the waveforms of gate-source voltages in the gate driving circuit shown in FIG. 3.

FIG. 4 is a timing chart showing an example of the waveforms of the gate-source voltages Vgsh and Vgsl of the high-side and low-side transistors QH and QL driven by the gate driving circuit GD2 configured as described above. In FIG. 4, broken lines represent the waveforms observed in a configuration without negative biasing.

As shown in FIG. 4, when the high-side transistor QH is off, Vgsh is a negative voltage Vn1; thus, even if, when the low-side transistor QL turns on, Vgsh hikes, Vgsh is prevented from rising above the threshold voltage Vth. It is thus possible to prevent erroneous turning-on of the high-side transistor QH. Likewise, when the low-side transistor QL is off, Vgsl is a negative voltage Vn2; thus, even if, when the high-side transistor QH turns on, Vgsl hikes, Vgsl is prevented from rising above the threshold voltage Vth. It is thus possible to prevent erroneous turning-on of the low-side transistor QL.

Here, as shown in FIG. 4, for example, when the low-side transistor QL turns off, Vgsl falls down to the negative voltage Vn2. This results in a longer falling time Tf2 than the falling time Tf1 observed when Vgsl falls down to 0 V as indicated by the broken lines, inconveniently leading to a higher loss at the turning-off. The same is true with the turning-off of the high-side transistor QH.

On the other hand, as shown in FIG. 4, for example, when with the high-side transistor QH off the low-side transistor QL turns off, the parasitic inductance Lpar (similar to the one in FIG. 1) acts to cause Vgsh drop in the negative direction. This means a drop below the negative voltage Vn1, and Vgsh may fall below the rated Vgst. Also when the high-side transistor QH turns off, a drop may occur in Vgsl.

2. Comparative Example

Now, a comparative example for comparison with the embodiments of the present invention will be described.

Figure 5:
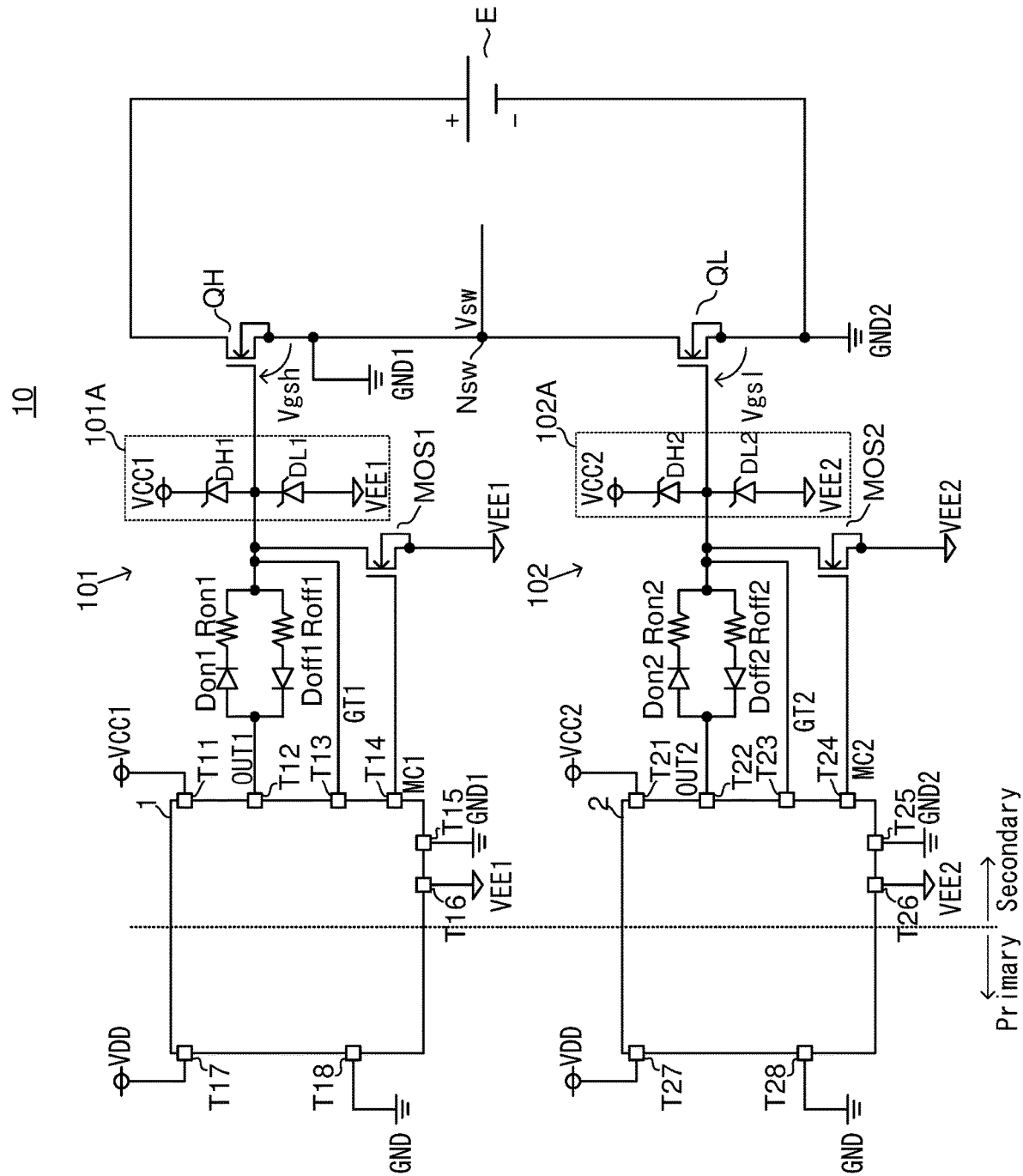
FIG. 5 is a diagram showing the configuration of a gate driving circuit of a comparative example.

FIG. 5 is a diagram showing the configuration of a gate driving circuit 10 of the comparative example. The gate driving circuit 10 drives the gates of a high-side transistor QH and a low-side transistor QL as driving target transistors.

The high-side and low-side transistors QH and QL are both configured as NMOS transistors. The drain of the high-side transistor QH is connected to the positive pole of a battery E. The source of the high-side transistor QH is connected to the drain of the low-side transistor QL at a node Nsw. The source of the low-side transistor QL is connected to the negative pole of the battery E. The battery E is, for example, a lithium battery.

The source of the high-side transistor QH is connected to an application terminal for a first ground GND1. The source of the low-side transistor QL is connected to an application terminal for a second ground GND2.

The gate driving circuit 10 includes a high-side driver 101 and a low-side driver 102. The high-side driver 101 drives the gate of the high-side transistor QH. The low-side driver 102 drives the gate of the low-side transistor QL.

The high-side driver 101 includes a high-side gate driver 1, an on diode Don1, an on resistor Ron1, an off diode Doff1, an off resistor Roff1, a mirror-clamp MOS transistor MOS1, and a gate protection circuit 101A.

The high-side gate driver 1 is a semiconductor device (IC package) produced by packaging an IC having its internal blocks integrated into a single chip. The high-side gate driver 1 has, as external terminals for establishing electrical connection with the outside, terminals T11 to T18. As shown in FIG. 5, the high-side gate driver 1 divides into a primary side and a secondary side that are electrically isolated from each other, with the terminals T17 and T18 at the primary side and the terminals T11 to T16 at the secondary side.

To the terminal T17 is connected an application terminal for a supply voltage VDD. To the terminal T18 is connected an application terminal for a ground GND. To the terminal T11 is connected an application terminal for a supply voltage VCC1 relative to the first ground GND1. To the terminal T15 is connected an application terminal for the first ground GND1. To the terminal T16 is connected an application terminal for a negative voltage VEE1 relative to the first ground GND1.

The terminal T12 is connected to the anode of the on diode Don1. The cathode of the on diode Don1 is connected to one terminal of the on resistor Ron1. The other terminal of the on resistor Ron1 is connected to the gate of the high-side transistor QH.

The terminal T12 is connected to the cathode of the off diode Doff1. The anode of the off diode Doff1 is connected to one terminal of the off resistor Roff1. The other terminal of the off resistor Roff1 is connected to the gate of the high-side transistor QH.

The mirror-clamp MOS transistor MOS1 is configured as an NMOS transistor. The drain of the mirror-clamp MOS transistor MOS1 is connected to the gate of the high-side transistor QH. The source of the minor-clamp MOS transistor MOS1 is connected to the application terminal for the negative voltage VEE1. The gate of the mirror-clamp MOS transistor MOS1 is fed with a mirror-clamp control signal MC1 fed out via the terminal T14.

The terminal T13 is connected to the gate of the high-side transistor QH to serve as a terminal at which to monitor the gate potential GT1 of the high-side transistor QH.

Figure 6:
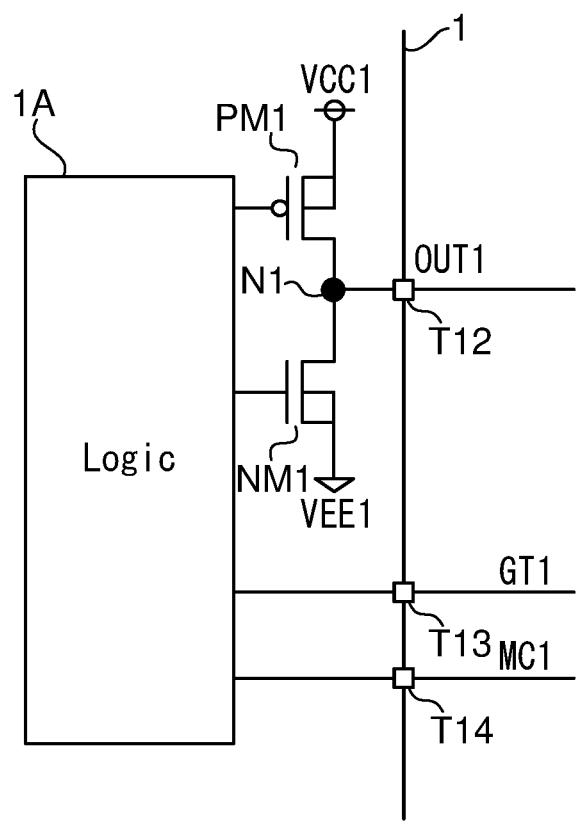
FIG. 6 is a diagram showing part of the internal configuration of a high-side gate driver.

FIG. 6 shows part of the internal configuration of the high-side gate driver 1. The internal configuration shown in FIG. 6 is that of the secondary side. As shown in FIG. 6, the high-side gate driver 1 includes a logic circuit 1A, a PMOS transistor PM1, and an NMOS transistor NM1. To the source of the PMOS transistor PM1 is connected the application terminal for the supply voltage VCC1. The drain of the PMOS transistor PM1 is connected to the drain of the NMOS transistor NM1 at a node N1. The source of the NMOS transistor NM1 is connected to the application terminal for the negative voltage VEEL The node N1 is connected to the terminal T12.

The high-side gate driver 1 is, at the primary side, fed with an unillustrated control input signal from the outside. This control input signal is, while being isolated inside the high-side gate driver 1, transmitted to the secondary side. According to the control input signal so transmitted, the logic circuit 1A drives the gates of the PMOS and NMOS transistors PM1 and NM2.

For example, in response to a control input signal that indicates "on", the logic circuit 1A keeps the PMOS transistor PM1 on and the NMOS transistor NM1 off so that a high-level gate output signal OUT1 is fed out via the terminal T12. In this case, electric charge is supplied via the on diode Don1 and the on resistor Ron1 to the gate of the high-side transistor QH. As a result, the gate-source voltage Vgsh of the high-side transistor QH rises and the high-side transistor QH turns on.

By contrast, in response to a control input signal that indicates "off", the logic circuit 1A keeps the PMOS transistor PM1 off and the NMOS transistor NM1 on so that a low-level gate output signal OUT1 is fed out via the terminal T12. In this case, electric charge is drawn via the off resistor Roff1 and the off diode Doff1 from the gate of the high-side transistor QH. As a result, the gate-source voltage Vgsh of the high-side transistor QH falls and the high-side transistor QH turns off.

When the high-side transistor QH turns off as described above, on detecting Vgsh having fallen to a predetermined voltage based on the gate potential GT1 applied to the terminal T13, the logic circuit 1A switches the minor-clamp control signal MC1 fed out via the terminal T14 from low level to high level. This turns the NMOS transistor NM1 on and the gate of the high-side transistor QH is fed with the negative voltage VEE1. Thus, even if, with the high-side transistor QH off, Vgsh hikes, Vgsh is prevented from rising above the threshold voltage Vth. It is thus possible to prevent erroneous turning-on of the high-side transistor QH.

Incidentally, when the above-mentioned control input signal indicating "on" is fed to the high-side gate driver 1, the logic circuit 1A switches the mirror-clamp control signal MC1 from high level to low level. This turns the NMOS transistor NM1 off.

The gate protection circuit 101A includes a high-side diode DH1 and a low-side diode DL1. The cathode of the high-side diode DH1 is connected to the application terminal for the supply voltage VCC1. The anode of the high-side diode DH1 is connected to the gate of the high-side transistor QH. The anode of the low-side diode DL1 is connected to the application terminal for the negative voltage VEE1. The cathode of the low-side diode DL1 is connected to the gate of the high-side transistor QH.

Configured as described above, the gate protection circuit 101A clamps the Vgsh of the high-side transistor QH, even if it tends to rise above VCC1, at VCC1 and clamps Vgsh, even if it tends to fall below the negative voltage VEE1, at VEE1. It is thus possible to prevent Vgsh from dropping until it falls below the rated value. Considering however that Vgsh falls below the rated value only momentarily with only a small effect on the high-side transistor QH, it is not essential to clamp Vgsh at VEE1.

On the other hand, the low-side driver 102 includes a low-side gate driver 2, an on diode Don2, an on resistor Ron2, an off diode Doff2, an off resistor Roff2, a mirror-clamp MOS transistor MOS2, and a gate protection circuit 102A.

The configuration of the low-side driver 102 is similar to that of the high-side driver 101 described previously and will therefore be described in a simplified way.

Specifically, the low-side gate driver 2 is configured similarly to the high-side gate driver 1 and has terminals T21 to T28, which correspond to the terminals T11 to T18. Moreover, to serve like the supply voltage VDD, the ground GND, the supply voltage VCC1, the gate output signal OUT1, the mirror-clamp control signal MC1, the first ground GND1, and the negative voltage VEE1 mentioned above, the low-side gate driver 2 is fed with, at the corresponding external terminals, the supply voltage VDD, the ground GND, a supply voltage VCC2, a gate output signal OUT2, a minor-clamp control signal MC2, the second ground GND2, and a negative voltage VEE2. Here, the supply voltage VCC2 and the negative voltage VEE2 are voltages relative to the second ground GND2.

The interconnections of the on diode Don2, the on resistor Ron2, the off diode Doff2, the off resistor Roff2, and the mirror-clamp MOS transistor MOS2 with the terminals T22 and the T24, the gate of the low-side transistor QL, and an application terminal for the negative voltage VEE2 are similar to those of the on diode Don1, the on resistor Ron1, the off diode Doff1, the off resistor Roff1, and the mirror-clamp MOS transistor MOS1 with the terminals T12 and T14, the gate of the high-side transistor QH, and the application terminal for the negative voltage VEE1. The gate of the low-side transistor QL is connected to the terminal T23. The terminal T23 is a terminal at which to monitor the gate potential GT2 of the low-side transistor QL, and corresponds to the terminal T13.

The gate protection circuit 102A is configured like the gate protection circuit 101A, with the high-side diode DH1, the low-side diode DL1, the supply voltage VCC1, and the negative voltage VEE1 in the latter replaced respectively with a high-side diode DH2, a low-side diode DL2, the supply voltage VCC2, and the negative voltage VEE2 in the former. The anode of the high-side diode DH2 and the cathode of the low-side diode DL2 are both connected to the gate of the low-side transistor QL.

The turning-on and -off of the low-side transistor QL and of the mirror-clamp MOS transistor MOS2 by the low-side gate driver 2 are similar to the turning-on and -off of the high-side transistor QH and of the mirror-clamp MOS transistor MOS1 by the high-side gate driver 1, and therefore will not be described in detail. The mirror-clamp MOS transistor MOS2 applies the negative voltage VEE2 to the gate of the low-side transistor QL, and this prevents erroneous turning-on of the low-side transistor QL resulting from a hike in the gate-source voltage Vgsl of the low-side transistor QL.

Moreover, the gate protection circuit 102A clamps Vgsl at VCC2 or VEE2. As with the gate protection circuit 101A described above, also here, clamping at VEE2 is not essential.

With the gate driving circuit 10 configured as described above, when the high-side transistor QH turns off, the mirror-clamp MOS transistor MOS1 is turned on, and thus Vgsh falls down to the negative voltage VEE1. As mentioned earlier, this results in a longer falling time Tf of Vgsh and hence a higher loss at the turning-off. The same is true with the loss at the turning-off of the low-side transistor QL.

3. First Embodiment

Figure 7:
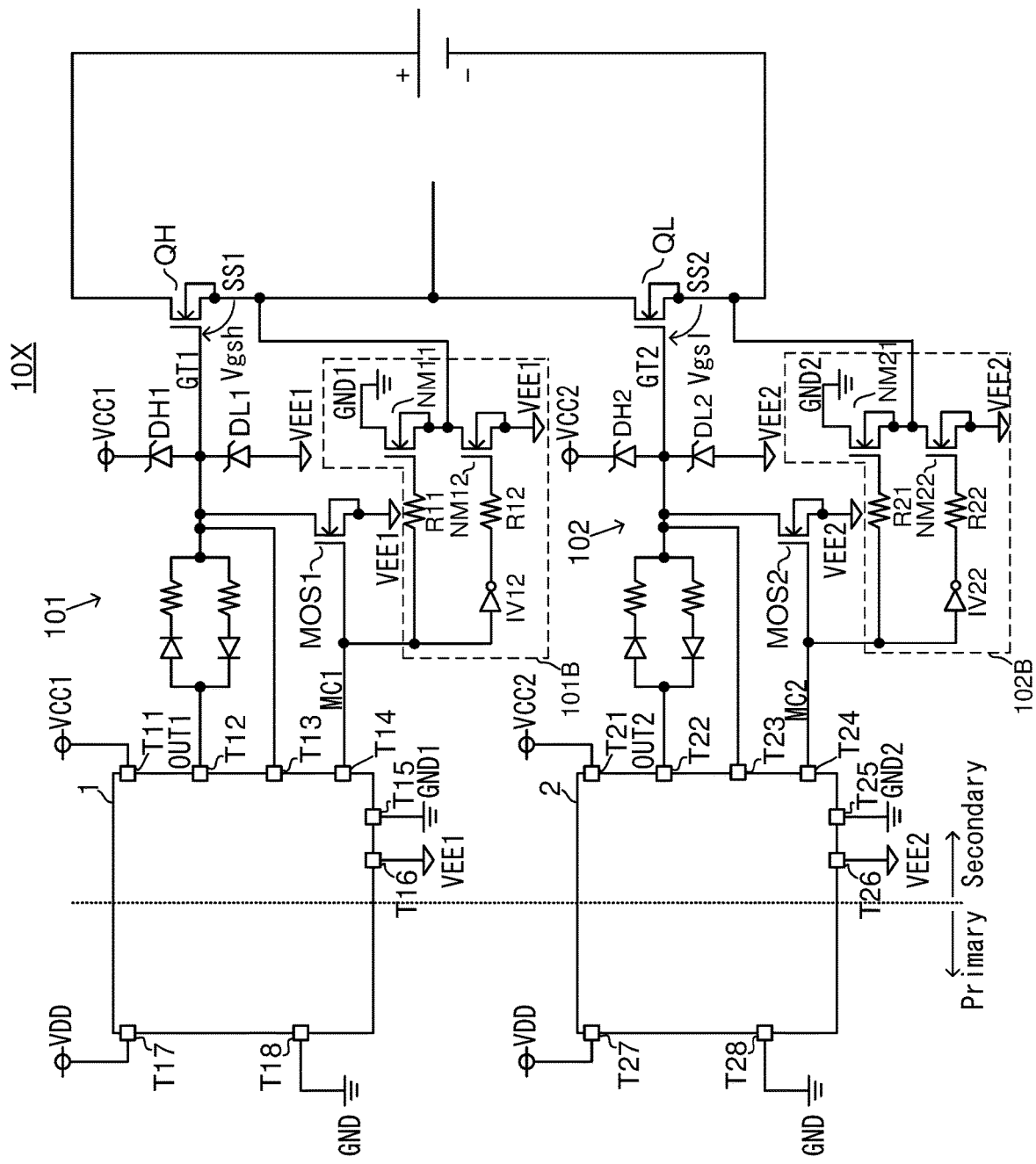
FIG. 7 is a diagram showing the configuration of a gate driving circuit according to a first embodiment of the present invention.

FIG. 7 is a diagram showing the configuration of a gate driving circuit 10X according to a first embodiment of the present invention. The gate driving circuit 10X shown in FIG. 7 differs from the comparative example (FIG. 5) described previously in that the high-side driver 101 includes a bias switcher 101B and that the low-side driver 102 includes a bias switcher 102B.

The bias switcher 101B includes an NMOS transistor NM11, an NMOS transistor NM12, resistors R11 and R12, and an inverter IV12. One terminal of the resistor R11 is connected to the terminal T14. The other terminal of the resistor R11 is connected to the gate of the NMOS transistor NM11. The drain of the NMOS transistor NM11 is connected to the application terminal for the first ground GND1. The input terminal of the inverter IV12 is connected to the terminal T14. The output terminal of the inverter IV12 is connected to one terminal of the resistor R12. The other terminal of the resistor R12 is connected to the gate of the NMOS transistor NM12. The source of the NMOS transistor NM12 is connected to the application terminal for the negative voltage VEEL The source of the NMOS transistor NM11 and the drain of the NMOS transistor NM12 are connected together at a node that is connected to the source of the high-side transistor QH.

The bias switcher 102B includes an NMOS transistor NM21, an NMOS transistor NM22, resistors R21 and R22, and an inverter IV22. One terminal of the resistor R21 is connected to the terminal T24. The other terminal of the resistor R21 is connected to the gate of the NMOS transistor NM21. The drain of the NMOS transistor NM21 is connected to the application terminal for the second ground GND2. The input terminal of the inverter IV22 is connected to the terminal T24. The output terminal of the inverter IV22 is connected to one terminal of the resistor R22. The other terminal of the resistor R22 is connected to the gate of the NMOS transistor NM22. The source of the NMOS transistor NM22 is connected to the application terminal for the negative voltage VEE2. The source of the NMOS transistor NM21 and the drain of the NMOS transistor NM22 are connected together at a node that is connected to the source of the low-side transistor QL.

Figure 8:
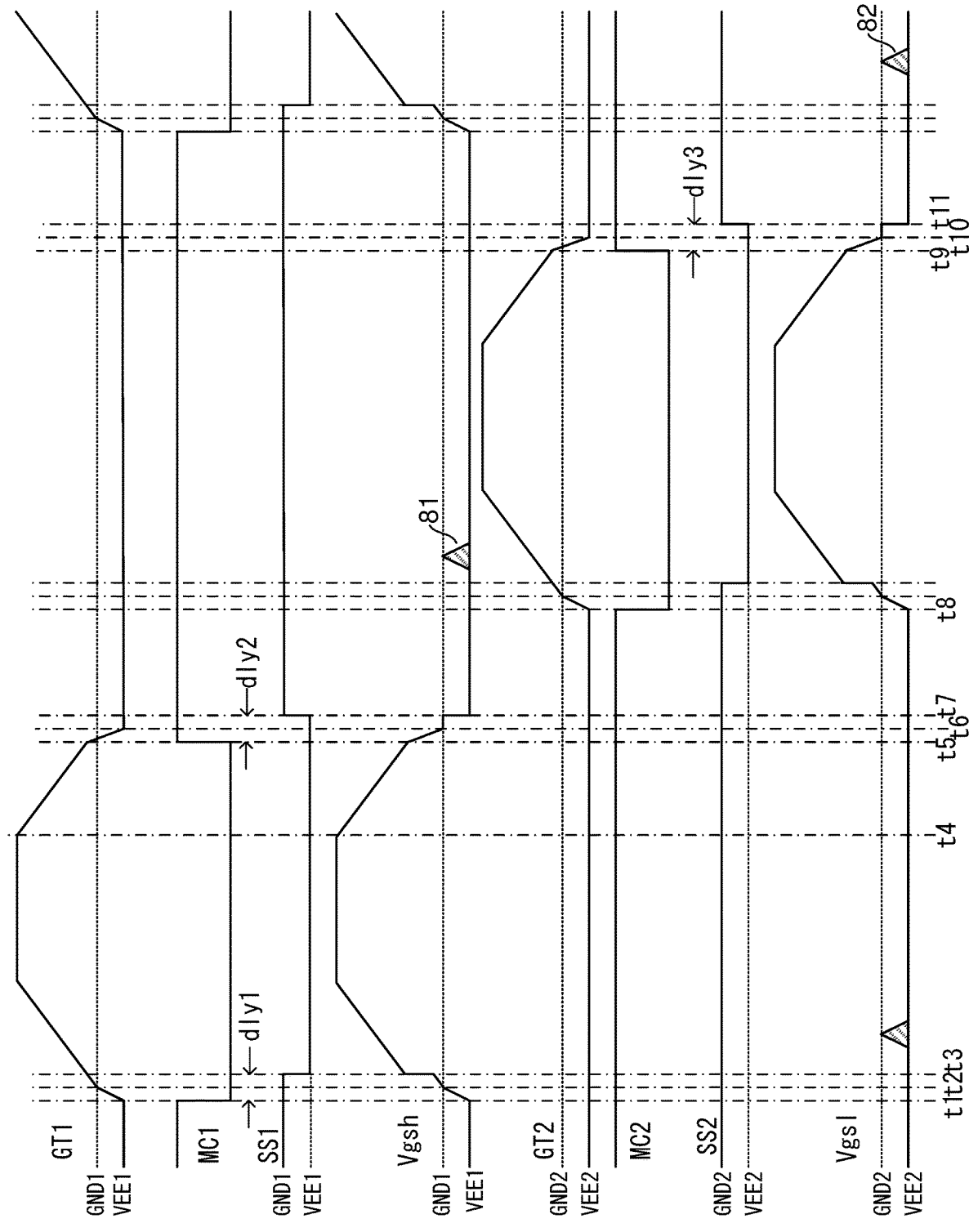
FIG. 8 is a timing chart showing an example of the operation of the gate driving circuit according to the first embodiment of the present invention.

FIG. 8 is a timing chart related to the gate driving operation of the gate driving circuit 10X shown in FIG. 7 with respect to the driving target transistors. FIG. 8 shows an example of the waveform of, from top down, the gate potential GT1 of the high-side transistor QH, the mirror-clamp control signal MC1, the source potential SS1 of the high-side transistor QH, the gate-source voltage Vgsh of the high-side transistor QH, the gate potential GT2 of the low-side transistor QL, the mirror-clamp control signal MC2, the source potential SS2 of the low-side transistor QL, and the gate-source voltage Vgsl of the low-side transistor QL.

As shown in FIG. 8, when at time point t1 a control input signal indicating "on" is fed to the high-side gate driver 1, the mirror-clamp control signal MC1 is turned to low level, and the minor-clamp MOS transistor MOS1 is turned off. This turns the gate output signal OUT1 to high level and the gate potential GT1 and the gate-source voltage Vgsh both start to rise from the negative voltage VEE1. Thus, the high-side transistor QH starts to turn on. In the bias switcher 101B, due to a delay ascribable to the resistors R11 and R12, the NMOS transistor NM11 remains on and the NMOS transistor NM12 remains off. Thus, the source potential SS1 is kept at the first ground GND1.

After that, at time point t3, that is, at the lapse of a delay time dly1 from time point t1, the NMOS transistor NM11 is turned off and the NMOS transistor NM12 is turned on; thus, the source potential SS1 is turned to the negative voltage VEEL As a result, the gate-source voltage Vgsh rises sharply.

After that, when at time point t4 a control input signal indicating "off" is fed to the high-side gate driver 1, the gate output signal OUT1 is turned to low level, and the gate potential GT1 and the gate-source voltage Vgsh both start to fall.

After that, when at time point t5 the gate potential GT1 is detected to have reached a predetermined voltage via the terminal T13, the high-side gate driver 1 turns the mirror-clamp control signal MC1 to high level. Thus, the minor-clamp MOS transistor MOS1 is turned on and the gate potential GT1 falls down to the negative voltage VEE1. Here, due to a delay ascribable to the resistors R11 and R12, the NMOS transistor NM11 remains off and the NMOS transistor NM12 remains on. Thus, the source potential SS1 is kept at the negative voltage VEEL As a result, the gate-source voltage Vgsh falls down to 0 V (GND1).

Then, at time point t7, that is, at the lapse of a delay time dly2 from time point t5, the NMOS transistor NM11 is turned on and the NMOS transistor NM12 is turned off; thus, the source potential SS1 is turned to the first ground GND1. After time point t5, from time point t6, when the gate-source voltage Vgsh reaches 0 V, to time point t7, the gate-source voltage Vgsh is kept at the first ground GND1. Then, at time point t7, the gate-source voltage Vgsh falls down to the negative voltage VEE1.

As described above, with this embodiment, at the turning-off of the high-side transistor QH, the gate-source voltage Vgsh falls down to the first ground GND1 and is then kept at the first ground GND1. This helps reduce loss.

At time point t7, the dead time, in which the high-side and low-side transistors QH and QL are both off, starts and, when at time point t8 the gate potential GT2 and the gate-source voltage Vgsl of the low-side transistor QL both start to rise, the dead time ends. When the gate-source voltage Vgsl rises, the low-side transistor QL turns on; at this time the gate-source voltage Vgsh of the high-side transistor QH, which is off then, may suffer a hike 81. However, since the gate-source voltage Vgsh is at the negative voltage VEE1, even a hike 81 occurs, the gate-source voltage Vgsh is prevented from reaching the threshold voltage of the high-side transistor QH. This prevents erroneous turning-on of the high-side transistor QH.

As with the high-side transistor QH, when the low-side transistor QL turns off, as shown in FIG. 8, the bias switcher 102B so operates that, at the lapse of a delay time dly3 from time point t9 that the mirror-clamp control signal MC2 turns to high level, that is, at time point t11, the source potential SS2 turns from the negative voltage VEE2 to the second ground GND2. Thus, the gate-source voltage Vgsl of the low-side transistor QL falls to reach the second ground GND2 at time point t10 and is then kept at second ground GND2 till time point t11. It is thus possible to reduce loss at the turning-off of the low-side transistor QL.

Moreover, as shown in FIG. 8, when with the low-side transistor QL is off the high-side transistor QH turns on, even if the gate-source voltage Vgsl suffers a hike 82, since the gate-source voltage Vgsl equals the negative voltage VEE2, the gate-source voltage Vgsl is prevented from reaching the threshold voltage of the low-side transistor QL. It is thus possible to prevent erroneous turning-on of the low-side transistor QL.

4. First Modified Example

Figure 9:
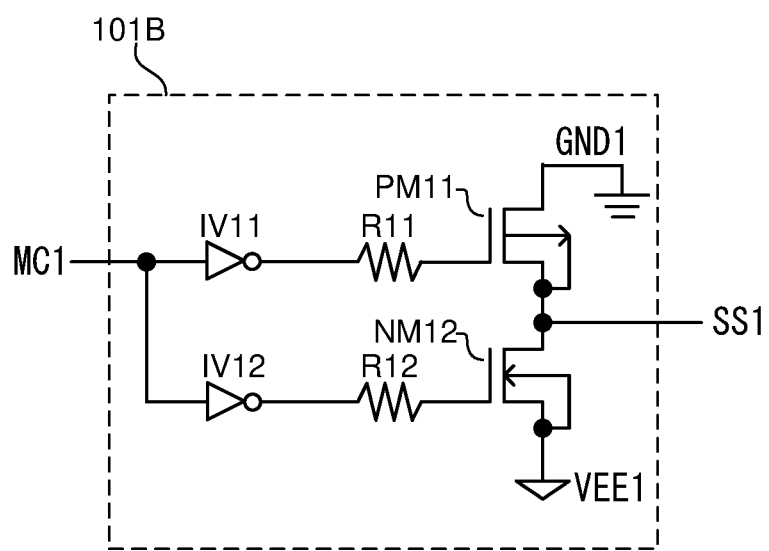
FIG. 9 is a diagram showing the configuration of a bias switcher according to a first modified example.

FIG. 9 is a diagram showing a first modified example of the bias switcher 101B. A similar modification can be applied to the bias switcher 102B.

In the configuration shown in FIG. 9. In place of the NMOS transistor NM11 (FIG. 7), a PMOS transistor PM11 is used. More specifically, the source of the PMOS transistor PM11 is connected to the application terminal for the first ground GND1. The drain of the PMOS transistor PM11 is connected to the drain of the NMOS transistor NM12. Between an application terminal for the minor-clamp control signal MC1 (i.e., the terminal T14 (FIG. 7)) and one terminal of the resistor R11, an inverter IV11 is inserted.

Also with the configuration of this modified example, as with the embodiment (FIG. 7) described previously, the source potential SS1 can be switched between the first ground GND1 and the negative voltage VEE1 according to the logic level of the mirror-clamp control signal MC1. Specifically, if the minor-clamp control signal MC1 is at high level, the PMOS transistor PM11 is on and the NMOS transistor NM12 is off; thus, the source potential SS1 equals the first ground GND1. By contrast, if the minor-clamp control signal MC1 is at low level, the PMOS transistor PM11 is off and the NMOS transistor NM12 is on; thus, the source potential SS1 equals the negative voltage VEE1.

5. Second Modified Example

Figure 10:
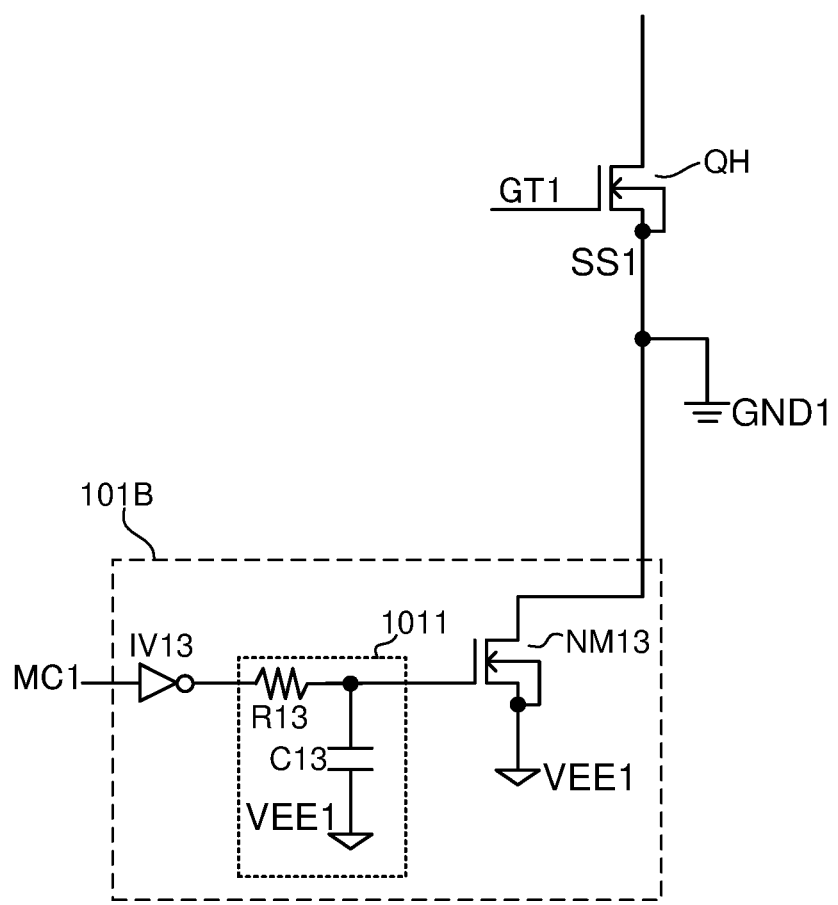
FIG. 10 is a diagram showing the configuration of a bias switcher according to a second modified example.

FIG. 10 is a diagram showing a second modified example of the bias switcher 101B. A similar modification can be applied to the bias switcher 102B.

The bias switcher 101B of the modified example shown in FIG. 10 includes an inverter IV13, a delay circuit 1011, and an NMOS transistor NM13. The application terminal for the mirror-clamp control signal MC1 (i.e., the terminal T14 (FIG. 7)) is connected to the input terminal of the inverter IV13. The output terminal of the inverter IV13 is connected to the input terminal of the delay circuit 1011.

The delay circuit 1011 is configured as an RC circuit composed of a resistor R13 and a capacitor C13. One terminal of the resistor R13 is connected to the output terminal of the inverter IV13. The other terminal of the resistor R13 is connected to one terminal of the capacitor C13. The other terminal of the capacitor C13 is connected to the application terminal for the negative voltage VEE1. The other terminal of the resistor R13 and one terminal of the capacitor C13 are connected together at a node (i.e., the output terminal of the delay circuit 1011) that is connected to the gate of the NMOS transistor NM13. The source of the NMOS transistor NM13 is connected to the application terminal for the negative voltage VEE1. The drain of the NMOS transistor NM13 is connected to the source of the high-side transistor QH. The source of the high-side transistor QH is connected to the application terminal for the first ground GND1.

Also with the configuration of this modified example, as with the embodiment (FIG. 7) described previously, the source potential SS1 can be switched between the first ground GND1 and the negative voltage VEE1 according to the logic level of the mirror-clamp control signal MC1. Specifically, if the mirror-clamp control signal MC1 is at high level, the NMOS transistor NM13 is off; thus, the source potential SS1 equals the first ground GND1. By contrast, if the mirror-clamp control signal MC1 is at low level, the NMOS transistor NM13 is on; thus, the source potential SS1 equals the negative voltage VEE1.

Moreover, owing to the delay circuit 1011, the source potential SS1 can be switched at a timing delayed from the timing at which the logic level of the minor-clamp control signal MC1 is switched.

6. Second Embodiment

Figure 11:
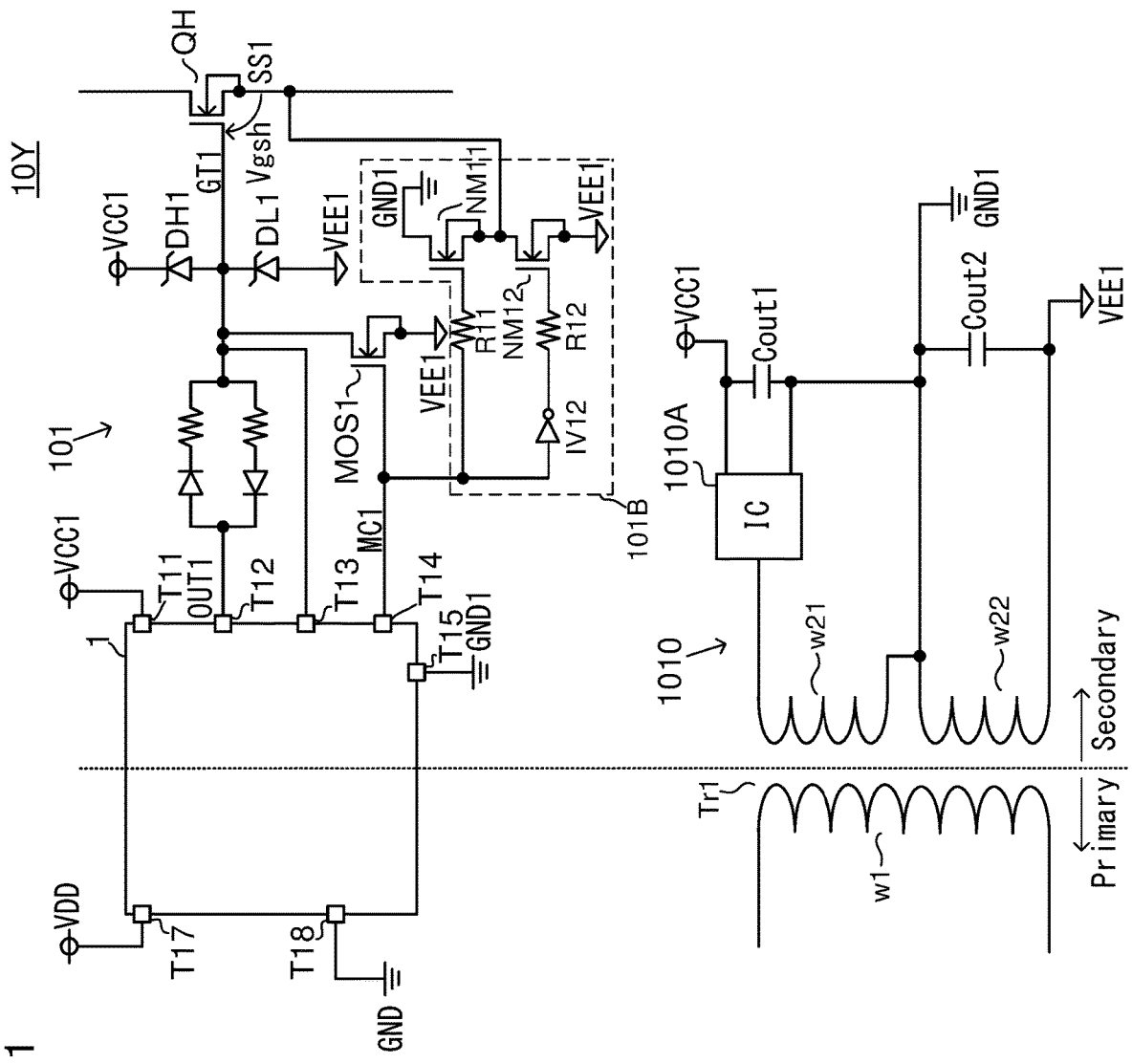
FIG. 11 is a diagram showing the configuration of a gate driving circuit according to a second embodiment of the present invention.

FIG. 11 is a diagram showing the configuration of a gate driving circuit 10Y according to a second embodiment of the present invention. The gate driving circuit 10X (FIG. 7) of the first embodiment described previously can generate the negative voltage VEE1 within the high-side gate driver 1, and has the terminal T16. In contrast, the gate driving circuit 10Y of the second embodiment can use a high-side gate driver 1 that does not have the terminal T16.

The gate driving circuit 10Y includes a power supply circuit 1010 that is arranged outside the high-side gate driver 1. The power supply circuit 1010 includes a transformer Tr1, an external power supply IC 1010A, and output capacitors Cout1 and Cout2. The transformer Tr1 has a primary winding w1 and secondary windings w21 and w22, and serves to isolate between the primary and secondary sides.

One terminal of the primary winding w1 is fed with an unillustrated direct-current voltage. To the other terminal of the primary winding w1, an unillustrated switching element is connected.

The input terminal of the external power supply IC 1010A is connected to one terminal of the secondary winding w21. The output terminal of the external power supply IC 1010A is connected to one terminal of the output capacitor Cout1. The other terminal of the output capacitor Cout1 is connected to the ground terminal of the external power supply IC 1010A. The other terminal of the output capacitor Cout1 and the other terminal of the secondary winding w21 are connected to the application terminal for the first ground GND1.

The external power supply IC 1010A, by switching the above-mentioned switching element on the primary side, generates based on a voltage appearing in the secondary winding w21 a supply voltage VCC1 that appears at one terminal of the output capacitor Cout1.

One terminal of the secondary winding w22 is connected to one terminal of the output capacitor Cout2. The other terminal of the secondary winding w22 is connected to the other terminal of the output capacitor Cout2 and to the application terminal for the first ground GND1. Based on a voltage appearing in the secondary winding w22 through the switching of the above-mentioned switching element on the primary side, a negative voltage VEE1 appears at one terminal of the output capacitor Cout2.

With the second embodiment configured as described above, the negative voltage VEE1 can be generated outside the high-side gate driver 1, and this eliminates the need to generate the negative voltage VEE1 within the high-side gate driver 1.

In a similar manner, also for the low-side gate driver 2, a power supply circuit that generates the negative voltage VEE2 can be provided outside the low-side gate driver 2. The first and second modified examples can be applied to the second embodiment.

7. Supplementary Notes

According to one aspect of the present disclosure, a gate driving circuit (10X) is configured to be capable of driving a driving target transistor (QH) having a gate and a first terminal (source), and includes:

an application terminal to which a negative voltage (VEE) is applied;

a driving transistor (MOS1) having a control terminal (gate) fed with a control signal (MC1), the driving transistor being connected between the gate of the driving target transistor and the application terminal; and a bias switcher (101B) configured to feed the first terminal of the driving target transistor with either a ground potential (GND1) or the negative voltage selectively according to the logic level of the control signal at a timing delayed from the timing at which the control signal switches its logic level. (A first configuration; FIG. 7.)

In the first configuration described above, the driving transistor may be an NMOS transistor (MOS1). (A second configuration; FIG. 7.)

In the first or second configuration described above, the bias switcher (101B) may include:
a first resistor (R11) having
a first terminal fed with the control signal and
a second terminal;
a first NMOS transistor (NM11) having
a gate connected to the second terminal of the first resistor,
a drain fed with the ground potential, and
a source;
an inverter (IV12) having
an input terminal fed with the control signal and
an output terminal;
a second resistor (R12) having
a first terminal connected to the output terminal of the inverter and
a second terminal; and
a second NMOS transistor (NM12) having
a gate connected to the second terminal of the second resistor,
a drain connected to the source of the first NMOS transistor, and
a source fed with the negative voltage. (A third configuration; FIG. 7.)

In the first or second configuration described above, the bias switcher (101B) may include:
a first inverter (IV11) having
an input terminal fed with the control signal and
an output terminal;
a first resistor (R11) having
a first terminal connected to the output terminal of the first inverter and
a second terminal;
a PMOS transistor (PM11) having
a gate connected to the second terminal of the first resistor,
a source fed with the ground potential, and
a drain;
a second inverter (IV12) having
an input terminal fed with the control signal and
an output terminal;
a second resistor (R12) having
a first terminal connected to the output terminal of the second inverter and
a second terminal; and
an NMOS transistor (NM12) having
a gate connected to the second terminal of the second resistor,
a drain connected to the drain of the PMOS transistor, and
a source fed with the negative voltage. (A fourth configuration; FIG. 9.)

In the first or second configuration described above, the first terminal of the driving target transistor may be fed with the ground potential, and
the bias switcher (101B) may include:
an inverter (IV13) having
an input terminal fed with the control signal and
an output terminal,
a delay circuit (1011) configured to delay the output of the inverter; and
an NMOS transistor (NM13) having
a gate fed with the output of the delay circuit,
a drain connected to the first terminal of the driving target transistor, and
a source fed with the negative voltage. (A fifth configuration; FIG. 10.)

In the fifth configuration described above, the delay circuit (1011) may include an RC circuit having a resistor (R13) and a capacitor (C13). (A sixth configuration; FIG. 10.)

In any of the first to sixth configurations described above, the driving target transistor may be an NMOS transistor (QH, QL). (A seventh configuration; FIG. 7.)

Any of the first to seventh configurations described above may include an IC package (1) having a first external terminal (T11), a second external terminal (T12), and a third external terminal (T13), and
the IC package may be configured
to be capable of feeding the gate of the driving target transistor with a gate output signal (OUT1) via the first external terminal,
to be capable of monitoring the gate potential (GT1) of the driving target transistor via the second external terminal, and
to be capable of feeding the control terminal of the driving target transistor with the control signal (MC1) via the third external terminal. (An eighth configuration; FIG. 7.)

The eighth configuration described above may further include a power supply circuit (1010) arranged outside the IC package (1),
the power supply circuit may include:
a transformer (Tr1) having a primary winding (w1) and a secondary winding (w2); and
an output capacitor (Cout2) having
a first terminal connected to the first terminal of the secondary winding and
a second terminal connectable to the second terminal of the secondary winding and to an application terminal to which the ground potential (GND1) is applied, and
the power supply circuit may be configured to be capable of generating the negative voltage (VEE1) at the first terminal of the capacitor. (A ninth configuration; FIG. 11.)

Any of the first to ninth configurations described above may further include a diode (DL1) having
a cathode connected to the gate of the driving target transistor and
an anode fed with the negative voltage. (A tenth configuration; FIG. 7.)

In any of the first to tenth configurations described above, the driving target transistor may be one of a high-side transistor (QH) and a low-side transistor (QL) connected in series between a supply voltage and a reference potential. (An eleventh configuration; FIG. 7.)

8. Modifications

The various technical features disclosed herein may be implemented in any manners other than as in the embodiments described above, and allow for many modifications without departure from the spirit of their technical ingenuity. That is, the embodiments described above should be understood to be in every aspect illustrative and not restrictive, and the technical scope of the present invention is defined not by the description of the embodiments given above but by the appended claims and encompasses any modifications within a scope equivalent in significance to what is claimed.

INDUSTRIAL APPLICABILITY

The present disclosure finds application, for example, in the driving of the gate of MOS transistors.

REFERENCE SIGNS LIST 1 high-side gate driver
1A logic circuit
2 low-side gate driver
10 gate driving circuit
10X, 10Y gate driving circuit
101 high-side driver
101A gate protection circuit
101B bias switcher
102 low-side driver
102A gate protection circuit
102B bias switcher
1010 power supply circuit
1010A external power supply IC
1011 delay circuit
C13 capacitor
Cgd gate-drain parasitic capacitance
Cout1, Cout2 output capacitor
DH1 high-side diode
DH2 high-side diode
DL1 low-side diode
DL2 low-side diode
Doff1 off diode
Doff2 off diode
Don1 on diode
Don2 on diode
DrH high-side driver
DrL low-side driver
E battery
GD1 gate driving circuit
GD2 gate driving circuit
IV11 inverter
IV12 inverter
IV13 inverter
IV22 inverter
Lpar parasitic inductance
MOS1 minor-clamp MOS transistor
MOS2 minor-clamp MOS transistor
NM, NM1 NMOS transistors
NM11, NM12, NM13 NMOS transistor
NM21, NM22 NMOS transistor
PM, PM1, PM11 PMOS transistors
QH high-side transistor
QL low-side transistor
R11-R13 resistor
R21, R22 resistor
Roff1 off resistor
Roff2 off resistor
Ron1 on resistor
Ron2 on resistor
T11-T18 terminal
T21-T28 terminal
Tr1 transformer
w1 primary winding
w21, w22 secondary winding

The invention claimed is:

1. A gate driving circuit configured to be capable of driving a driving target transistor having a gate and a first terminal, comprising:
   an application terminal to which a negative voltage is applied;
   a driving transistor having a control terminal fed with a control signal, the driving transistor being connected between the gate of the driving target transistor and the application terminal; and
   a bias switcher configured to feed the first terminal of the driving target transistor with either a ground potential or the negative voltage selectively according to a logic level of the control signal at a timing delayed from a timing at which the control signal switches a logic level thereof,
   wherein the first terminal of the driving target transistor is fed with the ground potential, and
   the bias switcher includes:
   an inverter having
      an input terminal fed with the control signal and
      an output terminal,
   a delay circuit configured to delay an output of the inverter; and
   an NMOS transistor having
      a gate fed with an output of the delay circuit,
      a drain connected to the first terminal of the driving target transistor, and
      a source fed with the negative voltage.

2. The gate driving circuit according to claim 1, wherein the driving transistor is an NMOS transistor.

3. The gate driving circuit according to claim 1, wherein the bias switcher includes:
   a first resistor having
      a first terminal fed with the control signal and
      a second terminal;
   a first NMOS transistor having
      a gate connected to the second terminal of the first resistor,
      a drain fed with the ground potential, and
      a source;
   an inverter having
      an input terminal fed with the control signal and
      an output terminal;
   a second resistor having
      a first terminal connected to the output terminal of the inverter and
      a second terminal; and
   a second NMOS transistor having
      a gate connected to the second terminal of the second resistor,
      a drain connected to the source of the first NMOS transistor, and
      a source fed with the negative voltage.

4. The gate driving circuit according to claim 1, wherein the bias switcher includes:
   a first inverter having
      an input terminal fed with the control signal and
      an output terminal;

a first resistor having
- a first terminal connected to the output terminal of the first inverter and
- a second terminal;

a PMOS transistor having
- a gate connected to the second terminal of the first resistor,
- a source fed with the ground potential, and
- a drain;

a second inverter having
- an input terminal fed with the control signal and
- an output terminal;

a second resistor having
- a first terminal connected to the output terminal of the second inverter and
- a second terminal; and an NMOS transistor having
- a gate connected to the second terminal of the second resistor,
- a drain connected to the drain of the PMOS transistor, and
- a source fed with the negative voltage.

5. The gate driving circuit according to claim 1, wherein the delay circuit includes an RC circuit having a resistor and a capacitor.

6. The gate driving circuit according to claim 1, wherein the driving target transistor is an NMOS transistor.

7. The gate driving circuit according to claim 1, further comprising an IC package having a first external terminal, a second external terminal, and a third external terminal, wherein the IC package is configured
- to be capable of feeding the gate of the driving target transistor with a gate output signal via the first external terminal,
- to be capable of monitoring a gate potential of the driving target transistor via the second external terminal, and
- to be capable of feeding the control terminal of the driving target transistor with the control signal via the third external terminal.

8. The gate driving circuit according to claim 7, further comprising a power supply circuit arranged outside the IC package,
wherein
the power supply circuit includes:
- a transformer having a primary winding and a secondary winding; and
- an output capacitor having
  - a first terminal connected to a first terminal of the secondary winding and
  - a second terminal connectable to a second terminal of the secondary winding and to an application terminal to which the ground potential is applied, and the power supply circuit is configured to be capable of generating the negative voltage at the first terminal of the capacitor.

9. The gate driving circuit according to claim 1, further comprising a diode having
- a cathode connected to the gate of the driving target transistor and
- an anode fed with the negative voltage.

10. The gate driving circuit according to claim 1, wherein the driving target transistor is one of a high-side transistor or a low-side transistor connected in series between a supply voltage and a reference potential.

* * * * *